United States Patent

Wada

[11] Patent Number: 5,532,507
[45] Date of Patent: Jul. 2, 1996

[54] MES FIELD EFFECT TRANSISTOR POSSESSING LIGHTLY DOPED DRAIN

[75] Inventor: Jun Wada, Yamanashi, Japan

[73] Assignee: Fujitsu Limited, Kawasaki, Japan

[21] Appl. No.: 362,124

[22] Filed: Dec. 22, 1994

[30] Foreign Application Priority Data

Dec. 28, 1993 [JP] Japan ..................... 5-336432

[51] Int. Cl.$^6$ .................... H01L 29/80; H01L 31/112; H01L 29/76
[52] U.S. Cl. .................... 257/280; 257/282; 257/408
[58] Field of Search ..................... 257/279, 280, 257/281, 282, 285, 472, 473, 476, 192, 194

[56] References Cited

U.S. PATENT DOCUMENTS

| 4,803,526 | 2/1989 | Terada et al. ............. 257/280 |
| 4,894,692 | 1/1990 | Noda et al. ............. 257/280 |

FOREIGN PATENT DOCUMENTS

| 0181091 | 5/1986 | Germany. |
| 8807364 | 12/1988 | Germany. |
| 41 01 130 | 7/1991 | Germany. |
| 1-11371 | 1/1989 | Japan ..................... 257/280 |
| 2252874 | 8/1992 | United Kingdom. |

OTHER PUBLICATIONS

Patent Abstracts of Japan. vol. 011 No. 292 (E–543), 19 Sep. 1987 & JP–A–62–092377 (Hitachi Ltd.; Others: 01) 27 Apr. 1987 *abstract*.

Patent Abstracts of Japan. vol. 013 No. 513 (E–847), 16 Nov. 1989 & JP–A–01 208869 (Fujitsu Ltd.) 22 Aug. 1989 *abstract*.

Matsunaga et al, T0.35 μM WNx/W gate BPLDD GaAs MESFET for ultraspeed digital IC Technical Report of IEICE, ED92 128, VW92 131 ICD92 119 (1993 01) pp. 35–40.

Primary Examiner—Wael M. Fahmy
Attorney, Agent, or Firm—Armstrong, Westerman, Hattori, McLeland & Naughton

[57] ABSTRACT

In a MESFET of this invention possessed of an LDD structure, a current control layer possessed of conduction type opposite to that of an active layer is formed below the active layer. In the part of this current control layer underlying a gate electrode, a low impurity concentration region destined to function as a channel region for a transistor is formed. Further, LDD regions are formed at both sides of the channel region. In the current control layer, the part underlying the channel region is kept at a low impurity concentration while the other parts underlying the LDD regions are kept at a higher impurity concentration than the part underlying the channel region. Thus, a MESFET possessed of an improved short channel effect and excellent high frequency characteristics is obtained.

10 Claims, 6 Drawing Sheets

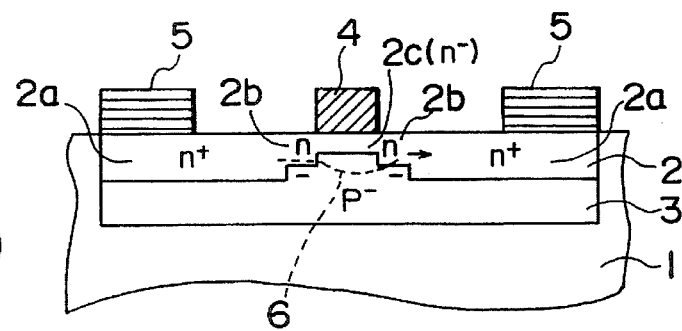
FIG. IA
(PRIOR ART)
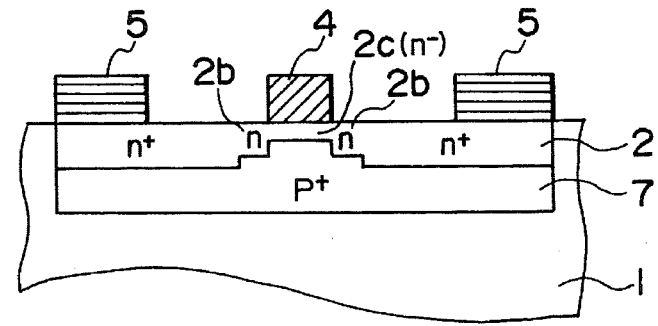
FIG. IB
(PRIOR ART)

GATE LENGTH (a.u.)

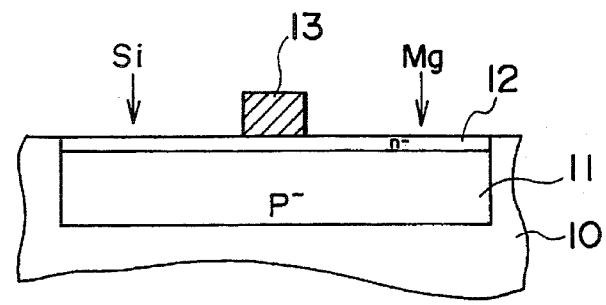
F I G. 4A
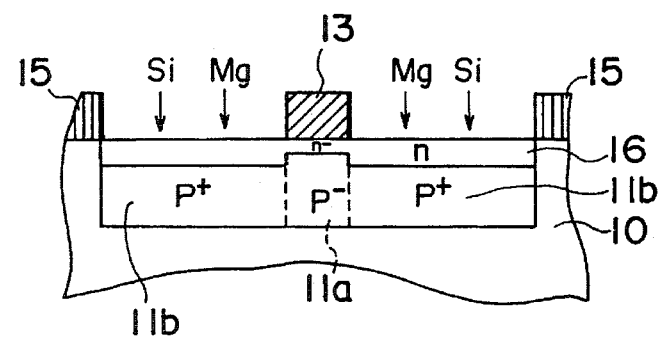
F I G. 4B
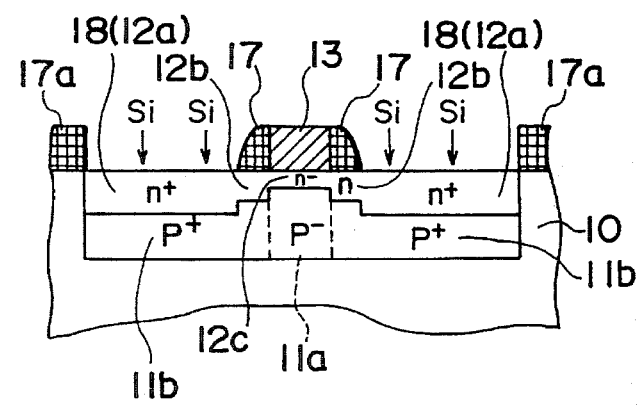
F I G. 4C

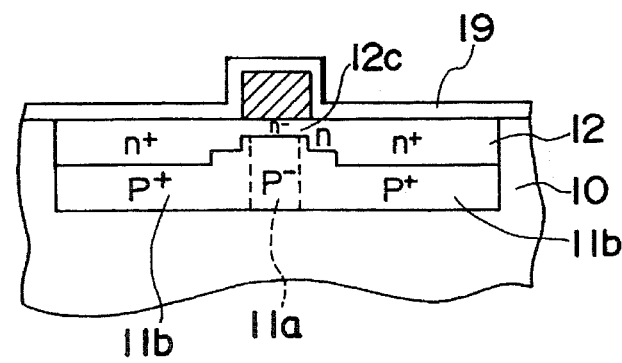
F I G. 4D
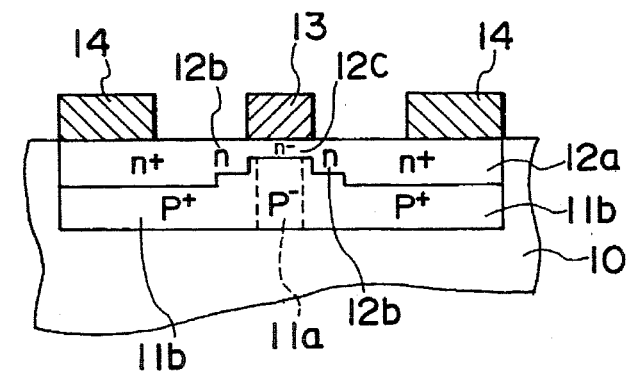
F I G. 4E

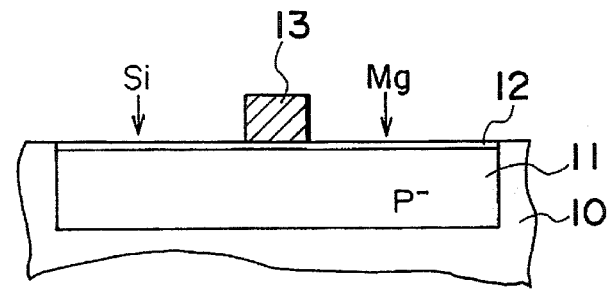
F I G. 5A
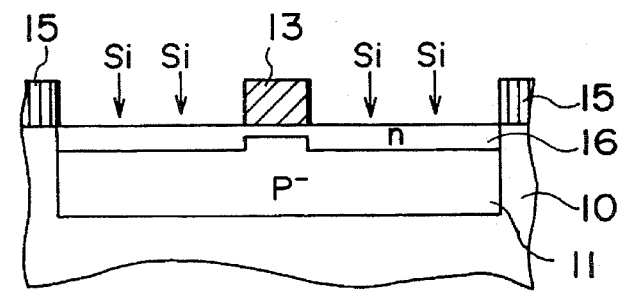
F I G. 5B
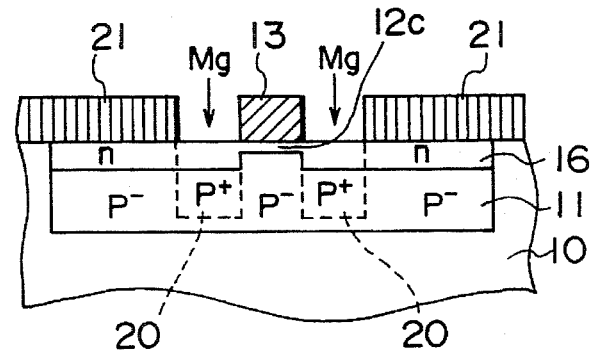
F I G. 5C

MES FIELD EFFECT TRANSISTOR POSSESSING LIGHTLY DOPED DRAIN

BACKGROUND OF THE INVENTION

1. Field of the Invention

This invention relates to a MES field effect transistor (hereinafter referred to as "FET") possessing an LDD (lightly doped drain) structure and a method for the production thereof and more particularly to a MESFET of the LDD structure provided directly below a gate with a buried layer for control of leak current.

2. Description of the Related Art

The MESFETs made of such compound semiconductors as GaAs have been showing a growing trend toward the decrease in channel length for the sake of improving the electrical characteristics of their own and exalting the adaptability thereof for integration (i.e. number of components per chip) in LSIs. In consequence of this trend, they have come to manifest the so-called short channel effect. The LDD structure using a lower impurity concentration in part of the drain region for repressing this short channel effect has been proposed. Further, a BPLDD structure has been proposed anew for precluding the current particularly flowing directly below a gate from leaking into a substrate in the LDD structure ["0.35 μm WNx/W gate BPLDD GaAs MESFET for ultraspeed digital IC," Matsunaga et al., Technical Report Of IEICE, ED92 128, VW92 131 ICD92 119 (1993 01), pp 35–40]. The BPLDD structure has a p type buried layer formed below an n type carrier conducting layer and, by dint of this buried layer, precludes the current flowing directly below a gate from leaking into a substrate.

FIG. 1A is a cross section illustrating the essential part of a conventional GaAs MESFET possessed of this BPLDD structure. In FIG. 1A, 1 stands for a semi-insulating GaAs substrate, 2 for an n type active layer forming a transistor region, 3 for a p type buried layer of relatively low impurity concentration, 4 for a gate electrode made of metal of high melting point, and 5 for a source and a drain electrodes. The n-type active layer 2 is composed of high impurity concentration regions 2a underlying the source and the drain electrodes, a low impurity concentration n type regions 2b for the LDD structure, and an n⁻ region 2c directly below the gate. The p type buried layer 3 functions as a layer for suppressing the current flowing through the substrate.

The conventional BPLDD structure configurated as described above is enabled by the presence of the p type buried layer 3 to prevent to a certain extent the current flowing directly below the gate from escaping in the form of leak current 6 into the substrate. The prevention so attained, however, is not fully satisfactory. In an improved version of MESFET illustrated in FIG. 1B, a buried p layer 7 is given an increased impurity concentration for the sake of further curbing the leakage of the current into the substrate.

FIG. 2 is a graph showing the relation between the gate length (the length in the direction of carrier movement) and the gate voltage threshold $V_{th}$ and the relation between the gate length and the parasitic capacity $C_{gs}$ of each of the GaAs MESFETs configurated as illustrated in FIGS. 1A and 1B. The curve B1 of the graph represents the $V_{th}$ characteristics of the GaAs MESFET of the configuration shown in FIG. 1A, the curve C1 thereof the $V_{th}$ characteristics of the improved device shown in FIG. 1B, the curve B2 thereof the $C_{gs}$ characteristics of the device shown in FIG. 1A, and the curve C2 thereof the $C_{gs}$ characteristics of the device shown in FIG. 1B. It is clear from this graph that the improved version of FET shown in FIG. 1B retains a high threshold voltage $V_{th}$ in spite of a small gate length as compared with the FET shown in FIG. 1A and, owing to this merit, fulfills the expected object of repressing the leak current and improving the short channel effect.

When the two FETs of FIG. 1A and FIG. 1B are compared in terms of the parasitic capacity $C_{gs}$, it is found that the improved FET shown in FIG. 1B exhibited a notably increased parasitic capacity for a fixed gate length as compared with the FET shown in FIG. 1A. This increase may well be regarded as a natural consequence of the fact that the buried p layer 7 in the FET of FIG. 1B is possessed of high impurity concentration.

In the FET of the conventional LDD structure described above, an effort to repress the leak current directly below the gate and improve the short channel effect by forming a buried layer of high impurity concentration possessing a conduction type opposite to that of an active layer brings about a converse effect of increasing the parasitic capacity and consequently degrading the high frequency characteristics of the FET. The degradation of the high frequency characteristics constitutes a serious problem because the GaAs MESFET is expected to find utility particularly in high frequency regions.

SUMMARY OF THE INVENTION

This invention has been produced for the purpose of solving the problems which are attendant on the MESFET of the conventional LDD structure as described above.

It is, therefore, a primary object of this invention to provide a MESFET of an LDD structure capable of improving the short channel effect without increasing the parasitic capacity of the device itself and a method for efficient production thereof.

The MESFET of the first aspect of this invention is provided with a first conduction type active layer disposed in a semi-insulating substrate and a second conduction type current control layer disposed under the active layer. The active layer comprises a low impurity concentration channel region underlying the gate electrode, LDD regions disposed so as to sandwich the channel region, and high impurity concentration of source and drain regions. The current control layer has formed in the part thereof below the source and drain regions high impurity concentration regions produced by the injection of a second conduction type impurity at a high concentration and in the part thereof below the channel region a low impurity concentration region. Further, this high impurity concentration region is extended past the LDD region slightly into the part below the channel region. The LDD region formed in the active layer, therefore, lies as surrounded by the high impurity concentration current control layer.

In the MESFET of the first aspect mentioned above, since the LDD region is surrounded by the high impurity concentration current control layer, the phenomenon that the current passing the channel region eventually escapes as a leak current into the substrate is curbed effectively. As a result, the degradation of the threshold voltage of this transistor in consequence of the decrease in the gate length can be effectively prevented. Since the parasitic capacity of the FET as a whole hinges heavily particularly on the capacity directly below the gate, the MESFET of this invention which has low impurity concentration imparted to the current control layer thereof directly,below the gate is enabled to curb the parasitic capacity to the same degree as is attained by the FET provided with the conventional low impurity concentration current control layer.

This invention, therefore, permits production of a MESFET of an LDD structure having the short channel effect improved without increasing the parasitic capacity of the transistor itself. Incidentally, an increase in the parasitic capacity goes to deteriorate the high frequency characteristics of the device (transistor). This is not the case with the device of this invention. According to this invention, therefore, a MESFET possessed of excellent high frequency characteristics can be obtained.

In the process of formation of the MESFET of the structure described above, particularly the current control layer thereof, first the second impurity is injected at a low impurity concentration to form the current control layer in the substrate and the second impurity is further injected with the gate electrode as a mask to impart high impurity concentration to the part of the current control layer other than the part thereof underlying the gate electrode. Thereafter, the substrate is annealed at an elevated temperature to enlarge slightly the high impurity concentration regions of the current control layer toward the part below the gate, namely toward the part below the channel region. As a result, the LDD regions in the active layer can be surrounded with the high impurity concentration regions in the current control layer.

In the MESFET of the second aspect of this invention, a second conduction type low impurity concentration current control layer is formed below a first conduction type active layer and a second conduction type impurity is further injected into parts in the vicinity of a gate electrode with the gate electrode as a mask. As a result, second conduction type high impurity concentration regions are formed in part of the low impurity concentration current control layer, namely in the parts below the LDD regions. Further, the high impurity concentration regions are so formed as to pass under the LDD regions and enter slightly into the channel region.

In the MESFET of the second aspect described above similarly to the MESFET of the first aspect, therefore, the LDD regions in the active layer are destined to be surrounded with the high impurity concentration regions possessed of a conduction type opposite to those of the LDD regions. Thus, this MESFET is enabled to curb the leakage of current into the substrate effectively. Further, the MESFET of this structure is enabled to repress the increase in the parasitic capacity of the device itself to the same degree as is attained by the conventional MESFET because the whole volume of the current control layer excepting the high impurity concentration regions mentioned above has low impurity concentration.

As a result, the MESFET consequently produced manifests an improved short channel effect and acquires excellent high frequency characteristics without increasing the parasitic capacity of the device itself.

In the MESFET of the second aspect mentioned above, a second conduction type impurity is injected at a low impurity concentration to form a current control layer and then the second conduction type impurity is further injected into the vicinity of the gate electrode with a gate electrode as a mask to form high impurity concentration regions. By annealing the substrate in this state at an elevated temperature, the second conduction type high impurity concentration regions are slightly enlarged below the channel region. As a result, the produced MESFET acquires a structure in which the LDD regions in the activated layer are surrounded by the high impurity concentration regions of the current control layer respectively.

BRIEF DESCRIPTION OF THE DRAWINGS

FIG. 1A is a cross section illustrating the essential part of an FET of a conventional BPLDD structure;

FIG. 1B is a cross section illustrating the essential part of improved version of the FET shown in FIG. 1A;

FIGS. 4A–4E are diagrams showing the steps of a process for the production of the FET shown in FIG. 3; and FIGS. 5A–5F are diagrams showing the steps of a process for the production of an FET as another embodiment of this invention.

DETAILED DESCRIPTION OF PREFERRED EMBODIMENTS

Now, this invention will be described in detail below with reference to the embodiments illustrated in the annexed drawings.

Figure 3:
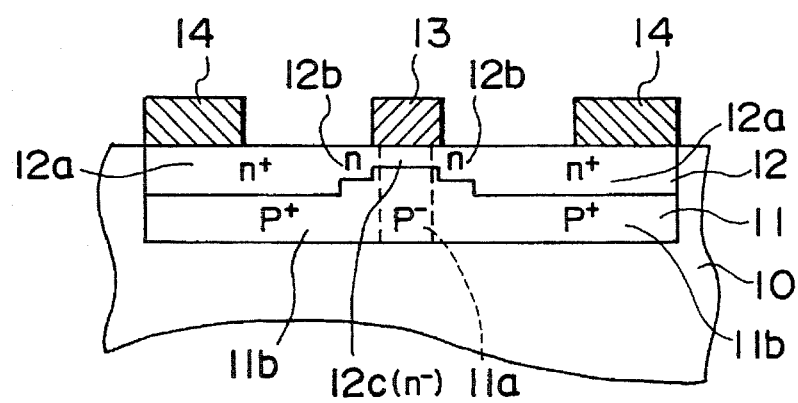
FIG. 3 is a cross section illustrating the essential part of an FET of an LDD structure as one embodiment of this invention.

FIG. 3 is a cross section illustrating the essential part of the structure of a GaAs MESFET as the first embodiment of this invention. In this diagram, 10 stands for a semi-insulating GaAs substrate, 11 for a p type buried layer, 12 for an n type active layer, 13 for a gate electrode made of tungsten silicate (WSi), and 14 for a source and a drain electrodes of gold or goldgermanium alloy.

The n type active layer 12 is composed of a low impurity concentration (n−) channel region 12c, low impurity concentrations (n) drain region 12b, and high impurity concentration (n+) source and drain regions 12a. The low impurity concentration (hereinafter referred to as concentration) drain regions 12b are provided for the purpose of imparting low concentration to the part of the source and drain regions 12a adjoining the gate and precluding the otherwise possible concentration of an electric field in these parts. The n type active layer 12 is vested with an LDD structure as described above.

The p type buried layer 11 in this embodiment is composed of a low concentration (p−) region 11a directly below the gate and high concentration (p+) regions 11b below the source and drain regions. The low concentration region 11a, as illustrated, is formed below the channel region 12c of the n type active layer and is given a smaller width than the channel region 12c.

The GaAs MESFET of the present embodiment is saliently characterized by having low concentration imparted to the part of the p type buried layer 11 underlying the channel region and high concentration to the remaining parts thereof as described above. Further, the p− type low concentration region 11a is characterized by being slightly narrower than the width of the n type channel region 12a. Since the n type active layer 12 is generally formed by performing the injection of an impurity at a plurality of steps, the channel region 12c, the low concentration drain regions 12b, and the high concentration source and drain regions 12a have different depths as illustrated. By forming the low concentration region 11a in the p type buried layer 11 in a slightly smaller width than the channel region, therefore, the n type low concentration drain regions 12b are surrounded by the high concentration p type regions 11b respectively as illustrated.

In the FET of FIG. 3, since each of the low concentration drain region 12b is surrounded by the high concentration region of opposite conduction type, the leak current from the region 12b is held back by the high concentration region 11b. As a result, this FET has the threshold voltage characteristics thereof improved to the same degree as the conventional FET illustrated in FIG. 1B which has the entire region thereof below the channel vested with high concentration. Since the parasitic capacity of the entire FET is mainly fixed by the capacity directly below the gate, the FET of this embodiment the current control layer of which has substantially the entire region thereof below the gate vested with low concentration is enabled to repress the magnitude of parasitic capacity to the same degree as the conventional FET illustrated in FIG. 1A.

Figure 2:
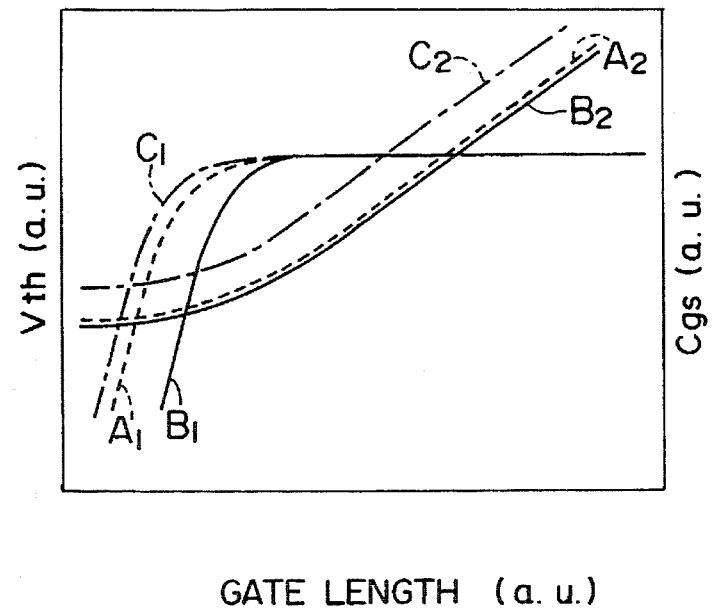
FIG. 2 is a diagram showing the electrical characteristics of an FET as one embodiment of this invention and the conventional FETs shown in FIG. 1A and FIG. 1B.

The curves A1 and A2 in FIG. 2 respectively represent the threshold voltage characteristics and the parasitic capacity characteristics of the FET of the embodiment described above. It is clearly noted from the diagram that the FET of the present embodiment has the threshold characteristics thereof improved to substantially the same degree as the improved FET illustrated in FIG. 1B and the parasitic capacity characteristics repressed to the same degree as the conventional FET illustrated in FIG. 1A.

Now, a method for the production of the GaAsFET mentioned above will be explained below with reference to FIGS. 4A–4E.

First, a p type impurity destined to form the current control layer 11 is injected into the semi-insulating GaAs substrate 10 as illustrated in FIG. 4A. This formation is implemented by injecting Mg as the p type impurity by the ion injection technique under the conditions of 180 KeV of acceleration voltage and $1 \times 10^{13}/cm^2$ of dosage. Then, the active layer 12 as a transistor region is formed by injecting Si as an n type impurity under the conditions of 30 KeV of acceleration voltage and $5 \times 10^{12}/cm^2$ of dosage. After the formation of the transistor region, WSi which is a high melting metal compound is deposited in a thickness of 4,500 Å by the spattering technique and the deposited layer of WSi is patterned to form the gate electrode 13.

Then, Mg is again ion injected under the conditions of 180 KeV of acceleration voltage and $2 \times 10^{13}/cm^2$ of dosage with the gate electrode 13 and a resist film 15 as masks to form the p type high concentration regions 11b as illustrated in FIG. 4B. As a result, the p type low concentration region 11a is automatically formed below the gate. Then, Si is again ion injected under the conditions of 80 KeV of acceleration voltage and $2 \times 10^{13}/cm^2$ of dosage to form an n type region 16 of slightly high concentration on the p type high concentration region 11.

Thereafter, a $SiO_2$ film is formed on the surface of the substrate and it is further patterned to form a side wall 17 of $SiO_2$ on the periphery of the gate electrode 13 as illustrated in FIG. 4C. Then, by ion injecting Si under the conditions of 150 KeV of accelerated voltage and $2 \times 10^{13}/cm^2$ of dosage with the side wall 17 and the $SiO_2$ films 17a as masks, n type high concentration regions 18 are formed. These regions serve as low resistance regions for establishing ohmic contact with the source and the drain electrodes.

As a result of the procedure mentioned above the low concentration (n–) region 12c below the gate, the low concentration (n) regions 12b below the side wall, and the high concentration (n+) source and drain regions 12a are formed in the n type active layer 12. The regions 12b are LDD regions respectively.

Then the side wall 17 and the $SiO_2$ films 17a are removed and a protection film 19 for an anneal, which is to activate the injected impurities is formed on the substrate as illustrated in FIG. 4D. This film 19 is formed by depositing A1N in a thickness of about 1000 Å by the reactive spattering technique. The resultant superposed layers, are annealed in an $N_2H_2$ atmosphere at 750° C. for 30 minutes. As a result, Mg ions in the high, concentration (p+) regions 11b are diffused in the direction of the low concentration region 11a to decrease the width of the region 11a as illustrated. The respective low concentration drain regions 12b therefore, are surrounded by a p+ region.

Finally, the source and the drain electrodes 14 are formed as illustrated in FIG. 4E to complete the FET.

Figure 5D:
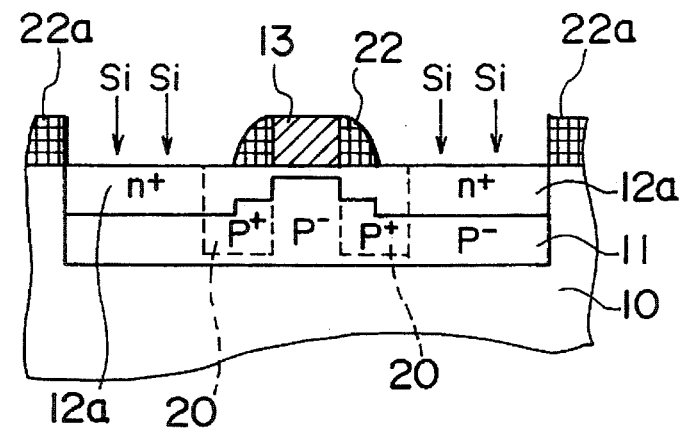
Figure 5E:
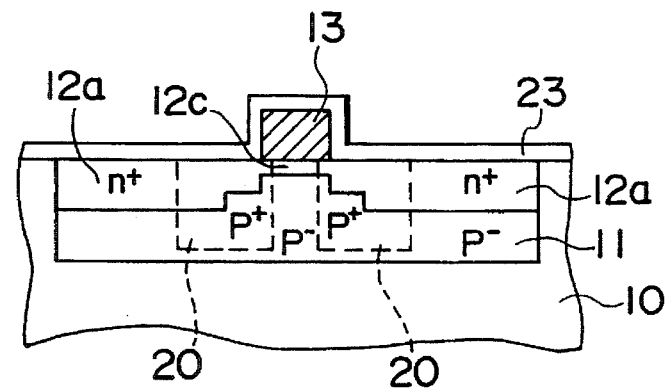
Figure 5F:
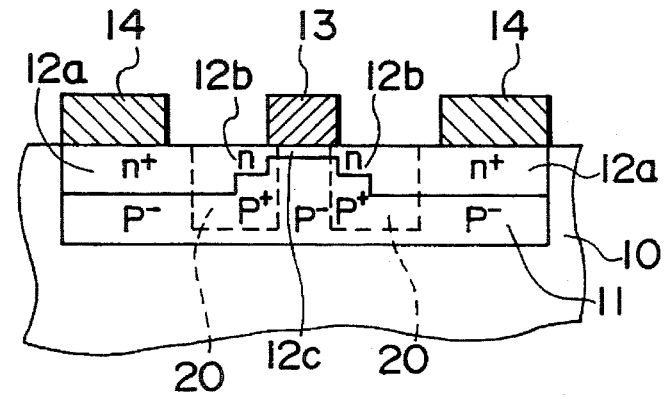

Now, the GaAs MESFET as the second embodiment of this invention will be explained below. This FET as illustrated in FIG. 5F which is a cross section illustrating the essential part thereof, is characterized by having p+ layers 20 formed in parts of the p– layer 11 so as to surround the low concentration drain regions 12b. Owing to this structure, the leak current passing the substrate is repressed and the threshold characteristics of the FET are improved. Further, since only parts of the p– layer have been converted into p+ regions, the parasitic capacity of the FET is not quite different from that of the conventional FET.

Now, the steps of a process for the production of the FET of the second embodiment mentioned above will be explained below with reference to FIGS. 5A–5F.

First, Mg as a p type impurity is ion injected into the semi-insulating substrate 10 of GaAs to form the current control layer 11 as illustrated in FIG. 5A. The conditions for this ion injection are 180 KeV of acceleration voltage and $1 \times 10^{13}/cm^2$ of dosage. Then, Si as an n type impurity is ion injected to form the active layer 12. The conditions for this ion injection 1 are 30 KeV of acceleration voltage and $5 \times 10^{12}/cm^2$ of dosage. Then, WSi which is a high melting metal compound is deposited in a thickness of 4500 Å by the spattering technique and the deposited layer of WSi is patterned to form the gate electrode 13.

Thereafter, Si is again ion injected with the gate electrode 13 and the first resist 15 as masks to form the carrier conducting layer 16 of slightly higher concentration than that of the region under the gate electrode 13 as illustrated in FIG. 5B. The conditions for this ion injection are 80 KeV of acceleration voltage and $2 \times 10^{13}/cm^2$ of dosage.

Then, a second resist film 21 is applied to the surface omitting the vicinity of the gate electrode and, with this resist film 21 and the gate 13 as masks, p type impurities are injected at slightly high concentration to form the p+ regions 20 in the layer 11. The conditions for the ion injection are 180 KeV of acceleration voltage and $2 \times 10^{13}/cm^2$ of dosage. The p type impurity is Subsequently, a side wall 22 made of $SiO_2$ is formed on the periphery of the gate electrode 13 and, with this side wall 22 and $SiO_2$ walls 22a as masks, Si ions are injected to form the low resistance regions 12a as illustrated in FIG. 5D. The conditions for this ion injection are 150 KeV of acceleration voltage and $2 \times 10^{13}/cm^2$ of dosage.

Then, the side wall 22 and the $SiO_2$ walls 22a are removed and A1N is deposited in a thickness of about 1000 Å by the spattering technique to form an A1N insulating film 23. With this film 23 as an anneal protection film, the substrate is annealed in an $N_2/H_2$ atmosphere at 750° C. for 30 minutes. As a result, the injected impurities are activated and, at the same time, the p+ regions 20 are enlarged and the ends thereof are made to force their way partly into the region underlying the channel as illustrated in FIG. 5E.

Finally, the anneal protection film 23 is removed and the source and the drain electrodes 14 are formed to complete the FET as illustrated in FIG. 5F.

Though the embodiments described above invariably use GaAs as the material for substrate, this invention does not need to limit the material to GaAs. Such ordinary III-V group compound semiconductors as InGaAs, AlGaAs, and InP, for example, are usable for the substrate. Further, the embodiments have been described as applied to the n channel FET. Of course, this invention can be applied as effectively to the p channel FET. In this case, an n type layer is used as the current control layer. The material for the gate electrode is only required to be capable of forming a Schottky barrier against the substrate made of a compound semiconductor. Concrete examples of the material fulfilling this requirement are W and WN. The conditions for the injection of various impurities mentioned above are suitably selected in accordance with the characteristic properties of the particular FET to be formed.

What is claimed is:

1. A MES field effect transistor (MESFET) having a lightly doped drain region, comprising:

a semi-insulating compound semiconductor substrate;

a first semiconductor layer of a first conductivity type formed in said semiconductor substrate and along a surface of the semiconductor substrate;

a second semiconductor layer of a second conductivity type formed in said semiconductor substrate and under said first semiconductor layer;

a gate electrode formed on said first semiconductor layer in Schottky contact with the first semiconductor layer;

a source electrode and a drain electrode formed on said first semiconductor layer and electrically connected with the first semiconductor layer;

wherein said first semiconductor layer includes first regions formed under said source and drain electrodes and having a first impurity concentration, a second region formed under said gate electrode and having a second impurity concentration lower than said first impurity concentration, and third regions formed between each of said first regions and said second region and having a third impurity concentration lower than said first impurity concentration and higher than said second impurity concentration;

said second semiconductor layer includes fourth regions formed under said first and third regions and having a fourth impurity concentration, and a fifth region formed under said second region and having a fifth impurity concentration lower than said fourth impurity concentration; and said fourth regions extend into the fifth region so as to physically separate the third regions from the fifth region.

2. The MESFET according to claim 1, wherein each of said first regions possesses a larger layer thickness than each of said third regions and each of said third regions possesses a larger layer thickness than said second region.

3. The MESFET according to claim 1, wherein said first conductivity type is n type and said second conductivity type is p type.

4. The MESFET according to claim 1, wherein said first conductivity type is p type and said second conductivity type is n type.

5. The MESFET according to claim 1, wherein said semi-insulating compound semiconductor substrate is made of III-V group compound semiconductors selected from the group consisting of GaAs, InGaAs, AlGaAs, and InP.

6. A MES field effect transistor (MESFET) having a lightly doped drain region, comprising:

a semi-insulating compound semiconductor substrate;

a first semiconductor layer of a first conductivity type formed in said semiconductor substrate and along a surface of the semiconductor substrate;

a second semiconductor layer of a second conductivity type formed in said semiconductor substrate and under said first semiconductor layer;

a gate electrode formed on said first semiconductor layer in Schottky contact with the first semiconductor layer;

a source electrode and a drain electrode formed on said first semiconductor layer and electrically connected with the first semiconductor layer;

wherein said first semiconductor layer includes first regions formed under said source and drain electrodes and having a first impurity concentration, a second region formed under said gate electrode and having a second impurity concentration lower than said first impurity concentration, and third regions formed between each of said first regions and said second region and having a third impurity concentration lower than said first impurity concentration and higher than said second impurity concentration;

said second semiconductor layer includes fourth regions having a higher impurity concentration than that of other parts of the second semiconductor layer, said sixth regions being formed under said third regions and parts of the second region so as to physically separate the third regions from a lower concentration part of the second semiconductor layer placed under the second region.

7. The MESFET according to claim 6, wherein each of said first regions possesses a larger layer thickness than each of said third regions and each of said third regions possesses a larger layer thickness than said second region.

8. The MESFET according to claim 6, wherein said first conductivity type is n type and said second conductivity type is p type.

9. The MESFET according to claim 6, wherein said first conductivity type is p type and said second conductivity type is n type.

10. The MESFET according to claim 6, wherein said semi-insulating compound semiconductor substrate is made of III-V group compound semiconductors selected from the group consisting of GaAs, InGaAs, AlGaAs, and InP.

\* \* \* \* \*